United States Patent
Hirano et al.

(10) Patent No.: US 7,509,001 B2
(45) Date of Patent: Mar. 24, 2009

(54) OPTICAL CIRCUIT BOARD

(75) Inventors: Koki Hirano, Hitachinaka (JP); Hiroki Yasuda, Mito (JP); Takami Ushiwata, Hitachi (JP); Masahiko Kobayashi, Hitachi (JP)

(73) Assignee: Hitachi Cable Ltd., Tokyo (JP)

( * ) Notice: Subject to any disclaimer, the term of this patent is extended or adjusted under 35 U.S.C. 154(b) by 0 days.

(21) Appl. No.: 11/935,548

(22) Filed: Nov. 6, 2007

(65) Prior Publication Data

US 2008/0152278 A1    Jun. 26, 2008

(30) Foreign Application Priority Data

Dec. 21, 2006   (JP)   .............................. 2006-344685

(51) Int. Cl.
*G02B 6/12* (2006.01)

(52) U.S. Cl. .............................. 385/14; 385/88; 385/89; 385/92

(58) Field of Classification Search .................... 385/14, 385/88, 89, 92; 398/164
See application file for complete search history.

(56) References Cited

U.S. PATENT DOCUMENTS

2005/0169639 A1 *   8/2005   Shen ........................... 398/164

FOREIGN PATENT DOCUMENTS

| JP | 2001-318250 | 11/2001 |
|---|---|---|
| JP | 2004-163722 | 6/2004 |

* cited by examiner

*Primary Examiner*—Frank G Font
*Assistant Examiner*—Michael P Mooney
(74) *Attorney, Agent, or Firm*—Mattingly, Stanger, Malur & Brundidge, PC

(57) ABSTRACT

An optical circuit board which facilitates a mounting process and provides advantageous aspects of electric interconnection and optical interconnection. An optical circuit board comprises a flexible circuit board composed of a film having a flexibility; one or more electric interconnections provided at the flexible circuit board; one or more optical interconnections provided at the flexible circuit board; an optical transmitter for converting an electric signal supplied at a designated electric interconnection of the electric interconnections provided at the flexible circuit board into an optical signal; and an optical receiver for reconverting the optical signal emitted by the designated electric interconnection provided at the flexible circuit board into an electric signal and for outputting the reconverted electric signal to another electric interconnection.

2 Claims, 4 Drawing Sheets

OPTICAL CIRCUIT BOARD

BACKGROUND OF THE INVENTION

The present invention relates to an optical circuit board that facilitates a mounting process and provides advantageous aspects of electric interconnection and optical interconnection.

With the expansion of services and applications for handling a large capacity of data such as images in the electronic equipment such as personal computers, cellular phones and television sets, the developments of high-speed and large-capacity data communication technologies are being promoted. In this technical environment, optical interconnection attracts the attention for enabling high-density, high-speed and large-capacity data communication within the electronic equipment or among a set of electronic equipment. In this context, "high-density" means a high transmission capacitance per unit volume. For example, the optical communication is recognized to be a high-density communication because the diameter of the single transmission line for transmitting the signal optically is 1 mm or smaller in contrast to the fact that the diameter of the single transmission line for transmitting the signal electrically is several millimeters.

In the prior art for the electric interconnection within the electronic equipment or among a set of electronic equipment, the high-speed signals may be converted temporarily into the low-speed signals, and then the converted signals are distributed into multiple (plural number of) electric interconnections placed at the flexible FPC (Flexible circuit board, hereinafter referred to as FPC). Coaxial cables are used as electric interconnections for transmitting signals faster than the electric interconnections on the flexible circuit board, and thus, by using coaxial cables, the number of multiple electric interconnections to be distributed can be reduced to be less than the number of electric interconnections on the flexible circuit board.

In order to make the signal much faster, it is required to implement the waveform correction circuit for correcting the waveform turbulence near the terminal end of the electric interconnection caused by the signal delay, etc. in the electric interconnection.

The optical interconnection for transmitting signals faster than the electric interconnection is mainly used for the long-distance information transmission, for example, intercontinental and inter-city networks which use optical interconnections for single mode transmission with less delay in the optical pulse. As for the short-distance LAN (Local Area Network), from the view point of easiness in connectivity of optical interconnections, multi mode transmission is mainly used in order to enable to make the diameter of the core of the optical interconnection larger.

BRIEF SUMMARY OF THE INVENTION

The electric interconnection is more bending tolerable than the optical interconnection is and hence, the electric interconnection can be bent at a right angle. Connecting electric interconnections is easier than connecting optical interconnections. The electric connector is at a lower price than the optical connector is. In addition, the electric connection can transmit the electric power more efficiently than the optical interconnection does.

The transmission capacitance per one channel (one core) for the electric interconnection is at most several Gbps, which requires additional channels or cores and waveform correction circuits in order to increase the signal speed in the future. However, as the number of cores increases, the interconnection cost may increase as well as the interconnection volume increases, which may suffer a space shortage. Additional waveform correction circuit may increase the overall cost for the electric interconnection because the device cost for the waveform correction circuits itself and its mount cost may be added.

In addition, the electric interconnection behaves as an antenna by itself and may irradiate electromagnetic waves outside and may generate electromagnetic noises due to incoming electromagnetic waves.

On the other hand, the optical interconnection may transmit the data at a higher speed with a less number of cores in comparison with the electric interconnection. In addition, the optical interconnection never generates the irradiation noise and never is affected by the incoming irradiation noise.

However, the optical interconnection has such problems that it is difficult to bend the optical interconnection at a right angle, and that the connecting position tolerance of 1 □m or smaller for the single mode and the coupling position tolerance of 10 □m or smaller for the multi mode are required in coupling the optical interconnections together, which are 10 times larger than the electric interconnections to be coupled together. Considering those things together, it is difficult to replace the electric interconnection directly for the optical interconnection. In addition, the optical connector for the optical interconnection may be priced higher than the electric connector for the electric interconnection.

In addition, it is difficult for the optical interconnection to transmit a large electric energy for driving the devices and so on. Thus, an applying the optical interconnection to the interconnection between the parts inside one electric equipment or to the interconnection between one electric equipment and another electric equipment is limited to the purpose of data transmission. This means that the individual electric interconnections for supplying the electric power are required for the individual parts inside the electric equipment or for the individual electric equipment itself.

An object of the present invention is to solve the above described problems and to provide an optical circuit board that facilitates a mounting process and provides advantageous aspects of electric interconnection and optical interconnection.

In one aspect of the present invention, the present invention comprises a flexible circuit board composed of a film having a flexibility; one or more electric interconnections provided at the flexible circuit board; one or more optical interconnections provided at the flexible circuit board an optical transmitter for converting an electric signal supplied at a designated electric interconnection of the electric interconnections provided at the flexible circuit board into an optical signal; and an optical receiver for reconverting the optical signal emitted by the designated electric interconnection provided at the flexible circuit board into an electric signal and for outputting the reconverted electric signal to another electric interconnection.

The present invention may comprise an electric connector having a terminal electrically conductive to the designated electric interconnection, and another electric connector having a terminal electrically conductive to another electric interconnection.

The electric connector may be disposed at one end of the flexible circuit board, and another electric connector may be disposed at the opposite end of the flexible circuit board. The electric interconnection may be disposed on the single face of the flexible circuit board, and the optical interconnection may be disposed on the other side face of the flexible circuit board.

The electric interconnection and the optical interconnection may extend in parallel to each other. The optical interconnection may be disposed on the exactly back side of the electric interconnection at the flexible circuit board. The placement spacing between plural optical interconnections may be equivalent to the placement spacing between plural electrical interconnections. The optical interconnection may comprise a polymer optical waveguide.

Furthermore, a mirror may be provided so as to face to the optical interconnection with 45-degree inclined to the flexible circuit board. The optical transmitter for converting the electric signal supplied from the electric interconnection and emitting the converted signal to the optical interconnection, and the optical receiver for converting the optical signal received at the optical interconnection into the electric signal and outputting the converted signal to the electric interconnection may be mounted on a single face of the flexible circuit board on which the electric interconnection is disposed. The optical transmitter and the optical receiver may be sealed with resin at the flexible circuit board.

The present invention provides the following significant effects;

(1) Easy to mount because of flexibility, (2) Coexisting advantageous features of both the electric interconnection enable to transmit a high electric energy and the optical interconnection enable to transmit the data in high speed, and (3) Easy to handle without using optical connectors.

DETAILED DESCRIPTION OF THE INVENTION

Now, referring to the attached drawings, the preferred embodiments of the present invention will be described in detail below.

Figure 1:
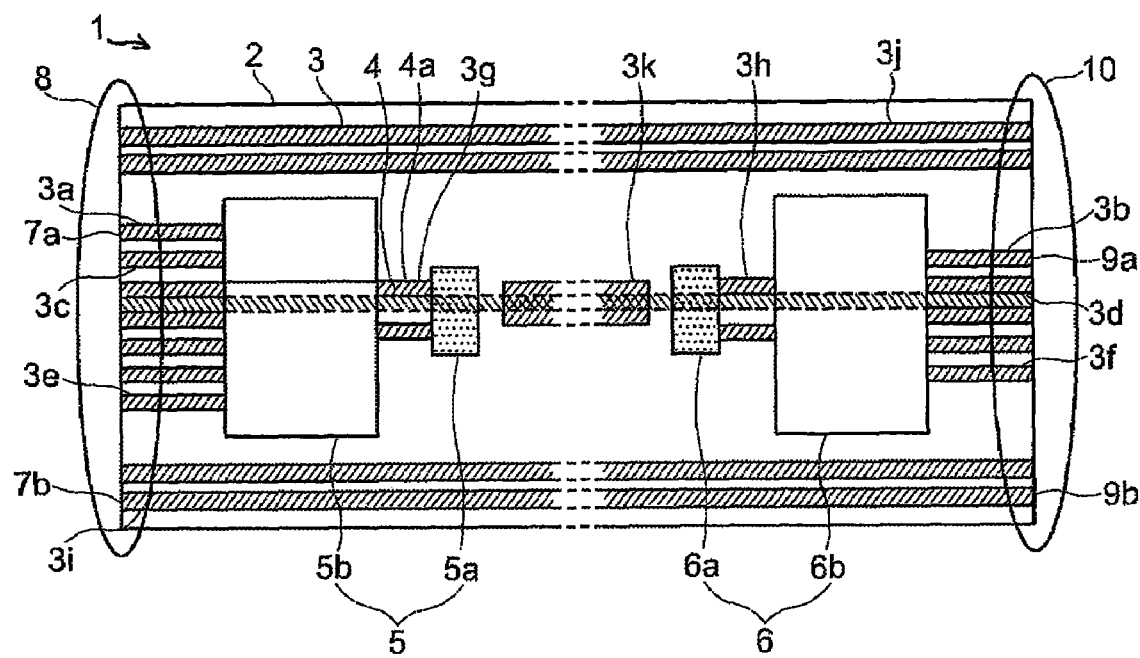
FIG. 1 is a plan view of the main part of the optical circuit board looking from the electric interconnection face, illustrating one embodiment of the present invention.

As shown in FIG. 1, the optical circuit board 1 according to the present invention comprises a flexible circuit board 2 composed of a film having a flexibility; an electric interconnection 3 disposed on the flexible circuit board 2; and an optical interconnection 4 disposed on the flexible circuit board 2. The optical interconnection 4 preferably has a flexibility. Though the shape of the flexible circuit board 2 is arbitrary, the shape of the flexible circuit board 2 in this embodiment is a simple ribbon (or an elongated rectangle) for ease of explanation. Note that the number of the electric interconnections 3 and the number of optical interconnections 4 are arbitrary, and that this embodiment uses plural electric interconnections 3 and a single optical interconnection 4.

The optical interconnection 4 is composed of the optical fiber or the optical waveguide. The optical interconnection 4 is preferably composed polymer optical waveguide from the viewpoint of material flexibility and easiness in mounting process. Glass optical waveguides and glass optical fiber have a problem in bending durability, which may sacrifice the flexibility of the material provided as the advantageous feature of the flexible circuit board 2, and therefore, it is difficult to establish a bending radius of 5 □m, for example. As the polymer-base optical fiber, which is flexible, has the diameter of 100 □m or larger, the transmission loss may occur at the optical coupling part between the polymer optical fiber and the light receiving device 6 which might have its light receiving diameter of 100 □m or smaller. As the core diameter can be adjusted to be between several mm and 100 □m in the polymer optical waveguide, the polymer optical waveguide, which even has its light receiving diameter of 100 □m or smaller, can be applied successfully. Thus, the optical interconnection 4 is preferably composed of the polymer optical waveguide.

Any type of resin having flexibility can be selected for the resin material for the polymer optical waveguide. For example, acryl-based resin, epoxy-based resin, silicon-based resin, polycarbonate-based resin and polystyrene-based resin are preferably selected with respect to such an advantageous feature as transparency. Polyimide-based resin and silicon-based resin are preferably selected with respect to such an advantageous feature as repetitive flexural offset yield strength.

In order to reduce the transmission loss due to bending for the optical interconnection 4, a larger relative refractive index difference between the core and the clad is preferred. Therefore, the relative refractive index difference should be controlled to be larger than a designated value so that the transmission loss at the optical interconnection 4 with the minimum bending radius required to the optical circuit board 1 may not exceed a designated value. For example, in case of forming a 90-degree bending part with a bending radius of 2 mm by assuming that the core diameter is 50 □m, the relative refractive index difference should be 3% or larger in order to limit the transmission loss up to 0.5 dB.

The optical circuit board 1 has an optical transmitter 5 which is mounted on the flexible circuit board 2 and converts the electrical signal input from the designated electric interconnection (electric interconnection for transmitting data) 3a to the optical signal, and emits the optical signal into the designated optical interconnection 4a, and an optical receiver 6 which is mounted on the flexible circuit board 2 and reconverts the incident optical signal from the optical interconnection 4a to the electric signal and outputs the reconverted electric signal to another electric interconnection (electric interconnection for transmitting data) 3b. The number of optical transmitters 5 and the number of optical receivers 6 to be mounted may be determined to be arbitrary numbers. In this embodiment, for ease of explanation, the number of optical transmitter 5 is one (1) and the number of optical receiver 6 is one (1), which means that a pair of optical transmitter and optical receiver are mounted. An optical link from the optical transmitter 5 to the optical receiver 6 is formed by connecting a pair of optical transmitter 5 and optical receiver 6 by the optical interconnection 4a.

Figure 2:
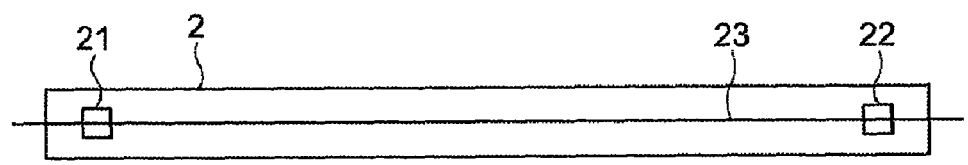
FIG. 2 is an overall plan view of the optical circuit board shown in FIG. 1.

As shown in FIG. 2, the light emitting position 21 for the optical transmitter 5 may be defined at the one terminal side of the flexible circuit board 2, the light receiving position 22 for the optical receiver 6 may be defined at the other terminal side of the flexible circuit board 2, and a hypothetical line 23 may be defined passing through the light emitting position 21 and the light receiving position 22. Owing to this configuration, the optical interconnection 24 is formed at the position (on the reverse face of the flexible circuit board 2) subjacent to the line 23.

In this embodiment, in addition to the electric interconnections 3a and 3b for transmitting data, the electric interconnections 3 include the electric interconnection 3c for controlling optical transmitters, the electric interconnection 3d for controlling optical receivers, the electric interconnection 3e for electric power supply and grounding for optical transmitter control, and the electric interconnection 3f for electric power supply and grounding for optical receiver control, the electric interconnection 3g for driving light emitting devices, the electric interconnection 3h for receiving light, the electric interconnection 3i for transmitting the low-speed data, the electric interconnection 3j for electric power supply and grounding and the electric interconnection 3k between the light emitting circuit and the light receiving circuit.

In this embodiment, the optical transmitter 5 is composed of the light emitting device 5a and the driver 5b, each formed separately. For example, VCSEL device may be preferably used for the light emitting device 5a, and VCSEL driver IC may be preferably used for the driver 5b. The optical receiver 6 is composed of the light receiving device 6a and the amplifier 6b, each formed separately. For example, photo diode may be preferably used for the light receiving device 6a, and photo diode signal amplifying IC may be preferably used for the amplifier 6b. Note that it is not required to align the light emitting device 5a and the driver 5b on the longer direction of the flexible circuit board 2 as shown in the figure, and that it is not required to align the light receiving device 6a and the amplifier 5b in the longer direction of the flexible circuit board 2 as shown in the figure. Alternatively, it is allowed to align them to be shifted in the shorter (width) direction of the flexible circuit board 2.

The optical transmitter 5 may convert a single channel high speed electric signal to the optical signal, or alternatively may have a functionality for multiplexing (in time-division multiplex or in wavelength-division multiplex) multi-channel high speed electronic signals to the optical signal. The optical receiver 6 may convert the optical signal to a single channel high speed electric signal, or alternatively may have a functionality for separating a single channel optical signal to multi-channel high speed electronic signals.

The optical circuit board 1 comprises an electric connector 8 having a terminal 7a connected electrically to the electric interconnection 3a, and another electric connector 10 having a terminal 9a connected electrically to another electric interconnection 3b. In addition, the optical circuit board 1 comprises another electric interconnection 3i connected electrically from another terminal 7b of the electric connector 8 to another terminal 9b of another electric connector 10.

The electric connectors 8 and 10 may be formed as contact makers supported with the housing and mounted on the surface of the optical circuit board 1. Alternatively, in this embodiment, edge connectors are used for the electric connectors. In this embodiment, the electric connector 8 is disposed on the one terminal side of the flexible circuit board 2, and another electric connector 10 is disposed on the other terminal side of the flexible circuit board 2.

In this embodiment, the electric interconnection 3 is disposed only on the single face of the flexible circuit board 2 (on the face as shown in the figure and hereinafter referred to as electric interconnection face), and the optical interconnection 4 is disposed only on the rear face of the flexible circuit board (hereinafter referred to as optical interconnection face).

In this embodiment, the electric device is mounted only on the single face of the flexible circuit board 2 (the electric interconnection face) on which the electric connection 3 is disposed, and there is no electric device mounted on the optical interconnection face. Note that the electric device implies the optical transmitter 5 and the optical receiver 6 (including the light emitting device 5a, the driver 5b, the light receiving device 6a and the amplifier 6b), but adequate active and/or passive devices other than those electric devices may be additively mounted on the electric interconnection face.

It is preferable that the electric interconnection 3 and the optical interconnection 4 may not intersect each other. In this embodiment, both the electric interconnection 3 and the optical interconnection 4 extend in an identical direction. This means that all the electric interconnection 3 and the optical interconnection 4 are formed to be parallel to the longer direction of the ribbon-shaped flexible circuit board 2.

It is preferable that the electric interconnection 3 and the optical interconnection 4 don't cross each other with a non-zero angle but they are aligned exactly to each other. The optical interconnection 4 may be disposed at the strictly opposite side of one of the plural electric interconnections 3 across the flexible circuit board 2. As the optical interconnection 4 is disposed at the strictly opposite side of the electric interconnection 3, there is such an effect that undesired bending deformation does not occur at the optical interconnection 4 when bending the flexible circuit board 2. In this embodiment, the electric interconnection 3k between the light emitting circuit and the light receiving circuit is formed between the position near the light emitting device 5a where the electric interconnection 3k does not contact to the light emitting device 5a and the position near the light receiving device 6a where the electric interconnection 3k does not contact to the light receiving device 6a. Note that the electric interconnection 3k between the light emitting circuit and the light receiving circuit may be formed at the same time and with the same material as another electric interconnections, but may be electrically inactive in order to provide the effect described above.

In this embodiment, as the light emitting device 5a and the light receiving device 6a are mounted on the electric interconnection face, where the optical interconnection 4 is not disposed, an optical path conversion part is required in order to connect optically the light emitting device 5a and the light receiving device 6a to the optical interconnection 4. As for the optical path conversion part, there are two forming methods; the optical interconnection 4 may be bent in the thickness direction of the flexible circuit board 2, and a mirror may be disposed. Though a bending space is required for accommodating the bending part of the optical interconnection 4, it is difficult to accommodate such bending part bent in the thickness direction inside the flexible circuit board 2. As for the optical path conversion part using the mirror, two alternative configurations may be considered; the mirror member may be formed so as to be an independent member and the mirror member may be formed by reforming the existing optical interconnection 4 by cutting in a designated angle, for example, 45 degrees. As the size of the mirror required in this embodiment is as large as the diameter of the core, that is, 100 ☐m or smaller, a separated member of mirror is too small to be handled in the fabrication process efficiently. On the other hand, the optical path conversion part having a mirror reformed with the optical interconnection 4 is preferably easy to handle in the fabrication process.

Figure 3:
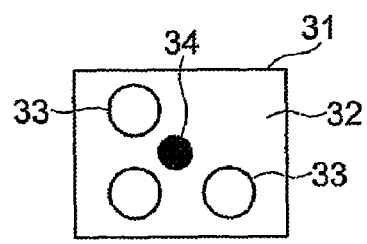
FIG. 3 is a plan view of the optical device mounted on the optical circuit board shown in FIG. 1, looking from the optical face.

By referring to FIG. 3 for further detail description, the optical device 31 realized as the light emitting device 5a or the light receiving device 6a has a plurality of electrodes 33 on the face 32 to be bonded onto the flexible circuit board 2. The optical device 31 also has an optical face 34 to be used as the light emitting face or the light receiving face on the face 32.

Figure 4:
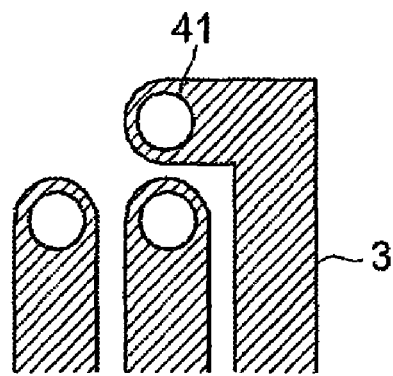
FIG. 4 is a magnified plan view of the main part of the optical circuit board shown in FIG. 1.

As shown in FIG. 4, the electric interconnection 3 composed of copper foil is disposed on the electric interconnection face of the flexible circuit board 2. A bonding part 41 enabling to bond with the electrode 33 is formed at a part of the electric interconnection 3. The bonding part 41 is disposed at the position corresponding to the electrode 33.

Figure 5:
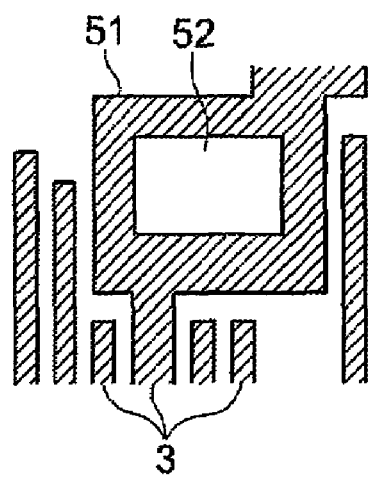
FIG. 5 is a magnified plan view of the main part of the optical circuit board shown in FIG. 1.

As shown in FIG. 5, a part of the electric interconnection 3 is formed as a land on which IC for the driver 5b or the amplifier 6b is mounted, and the IC mounting position 52 is defined in the region enclosed by the land 51. In addition, the electrode of IC is connected electrically to some electric interconnections 3.

Figure 6:
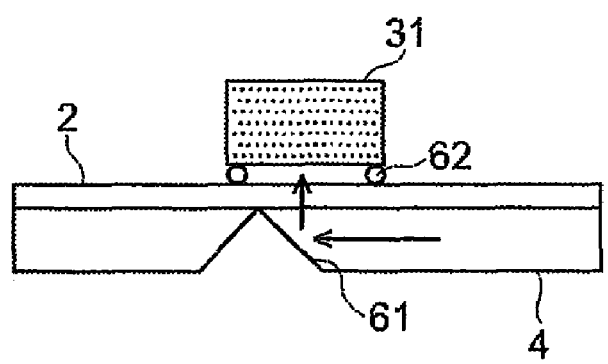
FIG. 6 is a horizontal cross-section view of the main part of the optical circuit board shown in FIG. 1.

As shown in FIG. 6, the optical device 31 is mounted on the electric interconnection face of the flexible circuit board 2 and the optical interconnection 4 is provided on the optical interconnection face. The mirror 61 is formed at the position opposite to the optical device 31 of the optical interconnection 41. As the mirror 61 faces to the optical interconnection 4 at an angle of 45 degrees with respect to the flexible circuit board 2, the path of the light transmitted through the optical interconnection 4 can be bent at an angle of 90 degrees so as to face to the optical device 31. The optical device 31 is mounted on the flexible circuit board 2 through Au bump 62.

Figure 7:
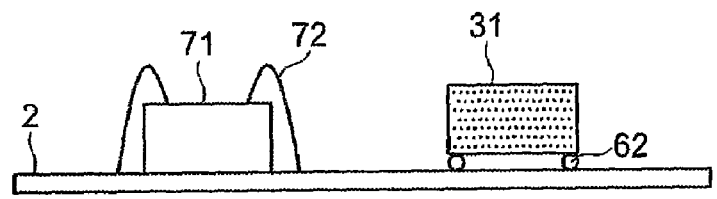
FIG. 7 is a horizontal cross-section view of the main part of the optical circuit board shown in FIG. 1.

As shown in FIG. 7, the housing (package) of IC 71 is fixed at the flexible circuit board 2, and the wire 72 is bonded from the electrode formed on the top face of IC 71 to the electric interconnection 3 (not shown in FIG. 7). The optical device 31 is mounted on the flexible circuit board 2 through Au bump 62.

Figure 8:
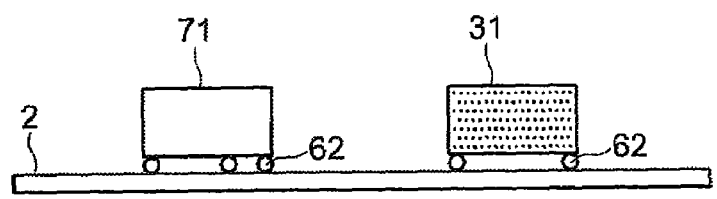
FIG. 8 is a horizontal cross-section view of the main part of the optical circuit board shown in FIG. 1.

Alternatively, as shown in FIG. 8, it is allowed that IC 71 as well as the optical device 31 is mounted on the flexible circuit board 2 through Au bump 62.

Next, the operation of the optical circuit board 1 will be described below.

When the electric signal is input to the terminal 7a of the electric connector 8 arranged at the one terminal side of the flexible circuit board 2, the electric signal is input to the driver 5b of the optical transmitter 5 through the electric interconnection 3a for transmitting data connected electrically to the terminal 7a. The light emitting device 5a convert the electric signal amplified by the driver 5b to the optical signal and radiates out the optical signal to the optical interconnection 4a. The optical signal transmitted through the optical interconnection 4a is received and reconverted to the electric signal by the light receiving device 6a of the optical receiver 6. Then, the electric signal is amplified by the amplifier 6b and transmitted to another terminal 9b of the electric connector 10 through the electric interconnection 3b for transmitting data.

On the other hand, when the electric signal is input to another terminal 7b of the electric connector 8, the electric signal is transmitted directly to another terminal 9b of another electric connector 10 through the electric interconnection 3i for transmitting low speed data connected electrically to the terminal 7a.

The electric power supply input at the electric connector 8 to the electric interconnection 3e for electric power supply and grounding for optical transmitter control is supplied to the optical transmitter 5. The electric power supply input at the electric connector 10 to the electric interconnection 3f for electric power supply and grounding for optical receiver control is supplied to the optical receiver 6.

The electric power supply input at the electric connector 8 to the electric interconnection 3j for electric power supply and grounding is led to the electric connector 10.

Next, the operation and effect of the optical circuit board 1 will be described.

One of the advantageous aspects of the optical circuit board 1 is to be handled easily because of its flexibility. The conventional optical circuit board is not flexible because it does not use the flexible circuit board 2 and the optical interconnection 4 having a flexibility. In contrast, the optical circuit board 1 is flexible because it uses the flexible circuit board 2 and the optical interconnection 4 having a flexibility.

Advantageous aspects in transmitting data through the optical interconnection 4a is to enable to transmit the data in high speed (that is, transmit the large capacity of data with small number of cores) and to protect the generation and influence of the electromagnetic radiation noises. Thus, when the electric signal for transmitting high speed data is input at the terminal 7a, the transmission loss of the electric signal output at the terminal 9a is small because the signal transmission at the optical circuit board 1 is established by the optical link.

On the other hand, as the low speed data is not required to be transmitted through the optical link, the low speed data may be input to another terminal 7b and transmitted directly to another terminal 9b. Therefore, in case of transmitting the high speed data and the low speed data in parallel, the optical link can be used more efficiently by separating the transmission paths for the high sped data and the low speed data individually and by transmitting the high speed data exclusively through the optical circuit board 1.

As the electric interconnection 3j for electric power supply and grounding is provided on the flexible circuit board 2 on which the optical interconnection 4a is also disposed at the optical circuit board 1, it will be appreciated that the separated and independent electric interconnection for supplying the electric power as in the conventional optical interconnection is not required to be disposed.

The interface outside to the optical circuit board 1 is only composed of the electric connectors 8 and 10, and the optical circuit board 1 does not exchange the optical signal directly to and from external components. Therefore, it will be appreciated that such complicated procedure as the alignment of the optical axis for connecting the optical signal cables to external components are not required and thus the optical circuit board is easy to handle. In addition, expensive optical connectors are not used. Summing up, the optical printed circuit 1 can maintain the high-speed data transmission and noise durability as one advantageous feature of the optical interconnection by way of inside structure of the optical printed circuit 1 itself, and the optical printed circuit 1 also can resolve the disadvantageous features such as difficulties in mounting process and an inevitable high cost of the conventional optical interconnection technologies.

In the optical circuit board 1, as the electric interconnection 3 is disposed only on the electric interconnection face, the optical interconnection 4 is disposed only on the optical interconnection face, and the electric devices are not mounted on the optical interconnection face but only mounted on the electric interconnection face, it will be appreciate that the electrical connection between the light emitting device 5a and the driver 5b (through the electrical connection 3g for driving light emitting devices and the electrical connection between the light receiving device 6a and the amplifier 6b (through the electrical connection 3h for receiving light) can be established easily.

As the electric interconnection 3 is disposed only on the electric interconnection face, the optical interconnection 4 is disposed only on the optical interconnection face, and the electric devices are not mounted on the optical interconnection face but only mounted on the electric interconnection face, it will be appreciated that the printed circuit part associated with the electric interconnection and the printed circuit par associated with the optical interconnection are separated. Therefore, it will be appreciated that both the electric interconnection 3 and the optical interconnection 4 can be laid out without considering the geometrical interference, which leads to a higher freedom in the interconnection layout design.

In the embodiment as shown in FIG. 1, the electrical interconnection 3 and the optical interconnection 4 are formed in parallel to the longer direction of the flexible circuit board 2. Note that, the layout of the electrical interconnection 3 and the optical interconnection 4 is not limited to this configuration but can be configured freely with a land or branch formed.

The optical circuit board 1 is so formed that the electric interconnection 3 and the optical interconnection 4 may not cross each other with a non-zero angle. Assuming that, for example, the electric interconnection 3 on the electric interconnection face and the optical interconnection 4 on the optical interconnection face could cross each other. As the stress may be concentrated locally at the optical interconnection 4 due to the existence of the electrical interconnection 3 at the crossing position when bending and/or twisting stress is applied to the flexible circuit board 2, the transmission loss in the optical interconnection may increase. On the other hand, in case that the electric interconnection 3 and the optical interconnection 4 don't cross each other with a non-zero angle, the mechanical stress may not be concentrated locally at the optical interconnection 4 even if bending and/or twisting stress is applied to the flexible circuit board 2, and thus, the transmission loss in the optical interconnection may not increase.

At the optical circuit board 1, the optical interconnection 4 is disposed on the exact back of the electric interconnection 3k between the light emitting circuit and the light receiving circuit. As for the fabrication process of the optical circuit board 1, the electric interconnection 3 is formed at first on the electric interconnection face of the flexible circuit board 2, and the optical interconnection 4 is formed later on the optical interconnection face of the flexible circuit board 2. As for the forming method of the optical interconnection 4, there are two alternative methods; one method in which the optical interconnection 4 is formed by applying a photo process to the flexible circuit board 2 directly mounted inside the die assembly and the other method in which the optical interconnection 4 is separately formed independent of the flexible circuit board 2 and then the optical interconnection 4 is bonded together with the flexible circuit board 2. In either method, in case that there are convex and/or concave parts in the optical interconnection 4, the convex and/or concave parts cause the decrease in the transmission loss of the optical interconnection 4. As the optical interconnection 4 is disposed on the exact back of the electric interconnection 3k between the light emitting circuit and the light receiving circuit, there is no cross point between the optical interconnection 4 and the electric interconnection 3 and therefore there is no convex and/or concave part in the optical interconnection 4, which can resolve the cause of increasing the transmission loss of the optical interconnection 4.

As the optical circuit board 1 is flexible and capable of transmitting the data in high-speed as well as low cost, the optical circuit board is optimum for cellular phones and the interface linking between the display driver and the display to be used for PC and television sets for which sophisticated low-profile design is required.

Next, another preferred embodiment will be described.

Figure 9:
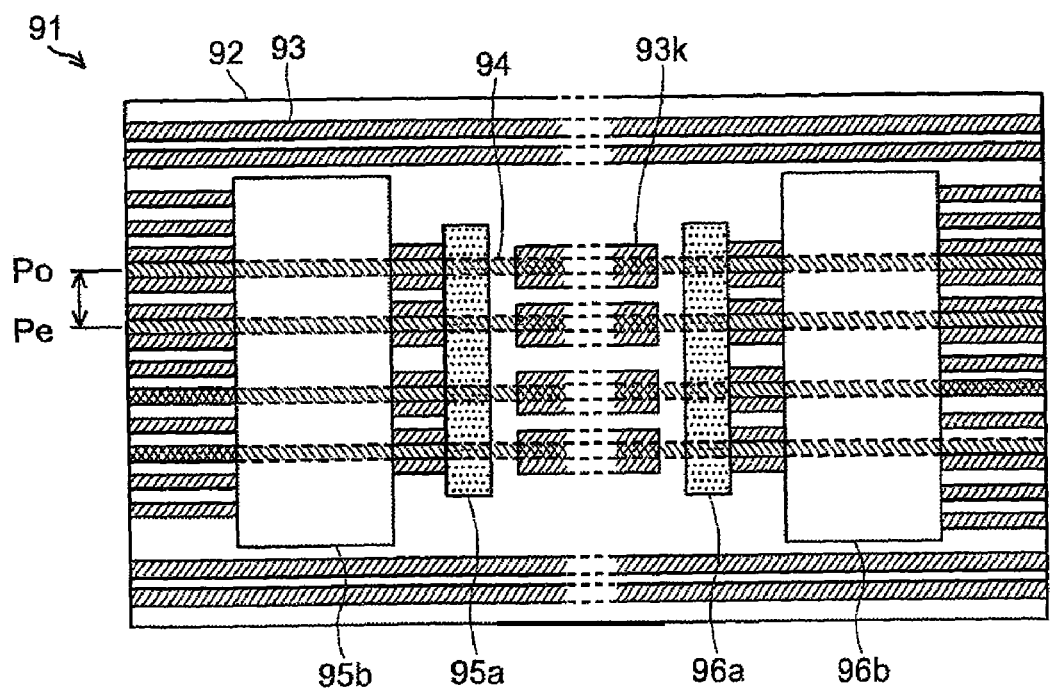
FIG. 9 is a plan view of the main part of the optical circuit board looking from the electric interconnection face in one embodiment of the present invention.

As shown in FIG. 9, the optical circuit board 91 according to the present invention comprises a flexible circuit board 92 composed of a film having a flexibility; an electric interconnection 93 disposed on the flexible circuit board 92; and an optical interconnection 94 disposed on the flexible circuit board 92. As is the case with the optical circuit board 1 shown in FIG. 1, the flexible circuit board 92 is shaped in a ribbon. However, the number of the electric interconnection 93 is greater than the number of the electric interconnection 3 in the optical circuit board 1 shown in FIG. 1, and the number of the optical interconnection 94 is four (4), which enables 4-channel optical signal transmission. Therefore, four pairs of optical transmitters and optical receivers are provided. Note that this embodiment is configured with four circuit devices 95a, 95b, 95c and 96c, each including four (4) sets of light emitting device, driver, light receiving device and amplifier.

In the optical circuit board 91, the placement spacing Po between adjacent optical interconnections 94 is preferably equal to the placement spacing Pe between adjacent electric interconnections 93 (the electric interconnections 93k between the light emitting circuit and the light receiving circuit, in this embodiment). This is because, even in case that the number of the optical interconnections 94 is greater than the number of the electric interconnections 93, the electric interconnection 93 can exist on the exactly back side of the optical interconnection 94 by making the placement spacing Po between the optical interconnections 94 equal to the placement spacing Pe between the electric interconnections 93.

In case that the deviation in the height of the electric interconnection 93 (the electric interconnections 93k between the light emitting circuit and the light receiving circuit) on the exactly back side of the optical interconnection 94 is large, a mechanical stress may be applied to the optical interconnection 94 when bending the flexible circuit board 92. In contrast, the mechanical stress may be preferably reduced by making the deviation in the height of the electric interconnection 93 small enough. Especially in the optical circuit board 91, in case that the deviation in the height of the electric interconnection 93 is 100 mm or smaller, the transmission loss can be reduced.

Next in the fabrication process, by sealing the individual circuit devices such as light emitting device, driver, light receiving device and driver which make up the optical transmitter and the light receiving device onto the flexible circuit board 2, the resistance to environment such as water resistance may be improved. As for the sealing method, a hermetic sealing method which uses glass or ceramic materials is supposed to be the most reliable. In the optical circuit board 1 using the flexible circuit board 2 according to the present invention, moisture permeation through the flexible circuit board can not be avoided even by sealing with glass or ceramic materials, and the complete hermetic sealing can not be attained. In addition, sealing with glass or ceramic materials may reduce the flexibility of the flexible circuit board 2. In order to solve those problems, sealing with polymer materials is preferable in the present invention because the complete hermetic sealing is not required but the flexibility of the flexible circuit board 2 is required.

As for the resin materials used for sealing, as transparency is required for sealing the optical devices, highly transparent materials such as acryl-based resin, epoxy-based resin and silicon-based resin are preferable. As for the sealing material for the drivers and amplifiers, which require heat radiation properties, it is preferable to use epoxy-based resin and acryl-based resin including additive fillers.

Next, an embodiment with a protective layer for enhanced bending durability will be described.

Figure 10:
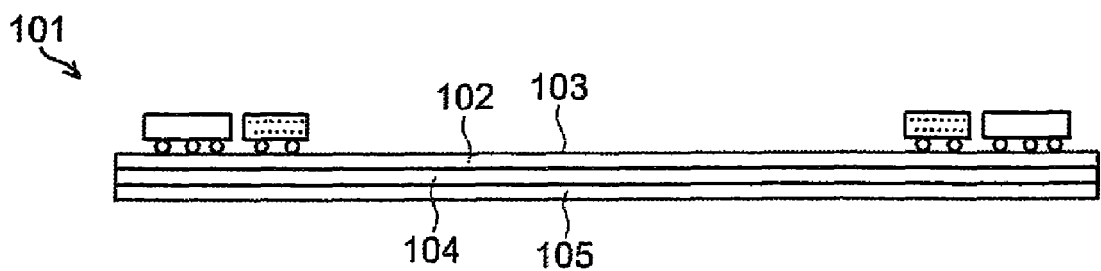
FIG. 10 is a horizontal cross-section view of the optical circuit board looking from the electric interconnection face illustrating one embodiment of the present invention.

As shown in FIG. 10, the optical circuit board 101 according to the present invention comprises a flexible circuit board 102 composed of a film having a flexibility; an electric interconnection 103 disposed on the flexible circuit board 2; an optical interconnection 104 having a flexibility and disposed on the flexible circuit board 102; and a protective layer (a protective film) 105 covering the optical interconnection 104. As for the material used for the protective layer 105, polyimide is used, for example.

As for the method for connecting electrically the electrode of the circuit device and the electric interconnection 3, there are generally a slip chip bonding method and a die bonding method. In the present invention, a slip chip bonding method is preferable because the optical coupling is established between the optical interconnection 4 disposed on the optical interconnection face of the flexible circuit board 2 and the optical device mounted on the electric connection face of the flexible circuit board 2. Especially, as shown in FIG. 3, it is preferable to use the optical device 31 in which the electrode 33 of the optical device 31 is formed on the same face 32 as the optical face 34. When the electrode 33 is positioned at the bonding part 41 on the electric interconnection face as shown in FIG. 4, the positioning of the optical component may be also attained at the same time as shown in FIG. 6. Owing to this fabrication process, it will be appreciated that low-cost can be achieved. Assuming that such an optical device with its electrodes formed on the both sides of the optical face is used, it is required to provide a wire bonding to the electrode formed on the rear face of the optical face. This configuration is not preferable because the cost for wire bonding may be added and the thickness of the optical circuit board may be increased dependent on the height of the bonding wire.

Embodiment 1

The flexible circuit board 2 is formed as a polyimide-based resin film with the dimension of 25 mm thickness, 5 mm width and 100 mm length, and three electric interconnections 3 are formed on the flexible circuit board 2, composed of 6±2 $\square$m thick copper, 5±2.5 $\square$m thick nickel and 3±0.1 $\square$m thick gold, respectively. Face-down type optical device 31 with its electrode 33 being formed on the same face 32 as the optical face 34 is used VCSEL and PD, and the layout of the electric interconnection 3 and the bonding part 41 is designed so that the electrode position of the photo device 31 may be matched to the bonding part 41 of the flexible circuit board 2.

The individual IC mounting positions 52 for the drivers 5b and the amplifiers 6b includes the positions located at one edge side and the positions the other edge side of the flexible circuit board 2, respectively. The dimension of the land 51 is 1.5 mm width and 2.5 mm length, which is made 0.5 mm in width and length larger than the dimension of IC71 with 1 mm width and 2 mm length. The electric interconnection 3 to be connected electrically to the electrode of IC71 also formed.

The electric interconnections 3a and 3b for transmitting data, the electric interconnection 3c for controlling optical transmitters, the electric interconnection 3d for controlling optical receivers, the electric interconnection 3e for electric power supply and grounding for optical transmitter control and the electric interconnection 3f for electric power supply and grounding for optical receiver control are provided between the IC mounting position 52 and the edge of the flexible circuit board 2. The electric interconnections 3h for receiving light are provided between the light emitting device 5a and the driver 5b, and between the light receiving device 6a and the amplifier 6b. The electric interconnection 3i for transmitting the low-speed data and the electric interconnection 3j for electric power supply and grounding are provided between the both edges of the flexible circuit board 2 (between the electric connector 8 and another electric connector 10). In addition, the electric interconnection 3k, having 200 $\square$m width, between the light emitting circuit and the light receiving circuit is disposed between the positions, each located 2 mm apart from the position of the light emitting device 5a and the position of the light receiving device 6a, respectively, on the hypothetical line connecting between the light receiving position 21 corresponding to the optical face 34 of the light emitting device 5a and the light receiving position 22 corresponding to the optical face of the optical face 34 of the light receiving device 6a.

Next, the polymer optical waveguide is formed as the optical interconnection 4 on the back side of the electric interconnection face of the flexible circuit board 2. At the same time, the optical interconnection 4 is disposed at the position exactly under the hypothetical line 23 on the basis of a part of the electric interconnection 3 already formed. The dimension of the optical interconnection 4 is 30 $\square$m under-clad thickness, 50 $\square$m core height, 50 $\square$m core width, and 20 $\square$m over-clad width measured above the core.

Figure 11:
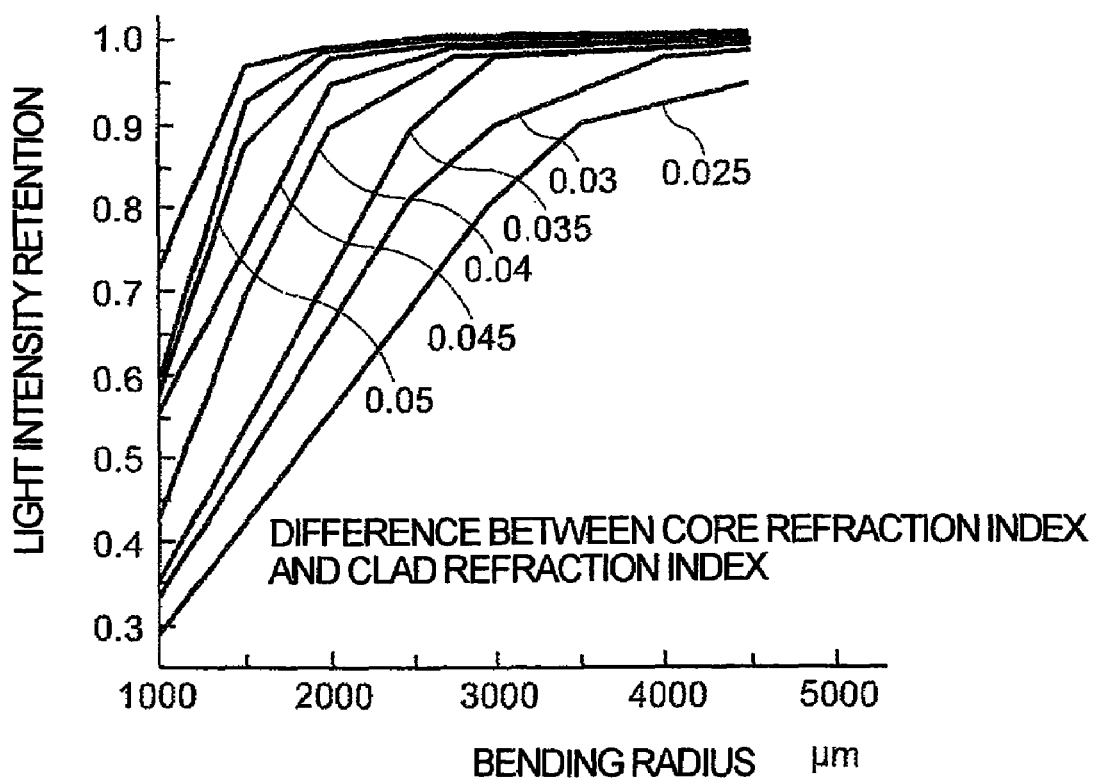
FIG. 11 is a characteristic chart of the bending characteristic (bending radius vs. light intensity retention characteristic) of the waveguide with the parameter of relative refractive index difference between the core and the clad.

The refractive indices of the core and clad are obtained from the bending characteristic curve shown in FIG. 11. In FIG. 11, the horizontal axis represents the bending radius and the vertical axis represents the light intensity retention, in which the relative refractive index difference is a variable parameter. It is proved by reviewing FIG. 11 that the light intensity retention is small even if the bending radius is relatively large in case that the relative refractive index difference is smaller, and that the light intensity retention is large even if the bending radius is smaller in case that the relative refractive index difference is larger. In a quantitative discussion, in case that the refractive index of the clad is 1.50, the transmission loss occurs significantly for 2 mm bending radius in case that the relative refractive index difference between the core and the clad is 0.05 or smaller. In Embodiment 1, the refractive index of the clad may be determined to be 1.50 and the refractive index of the core may be determined to be 1.55.

Note that the light intensity retention defines numerically the existence of transmission loss and the degree of transmission loss, in which the light intensity retention is 1 when no transmission loss and the light intensity retention is 0.9 when 10% transmission loss. Note also that the transmission loss is 0.5 dB when the light intensity retention is 0.9. As 10% transmission loss is a threshold for judging the substantial existence of the transmission loss in the present invention, it is preferable that the light intensity retention is 0.9 or higher.

Silicon-based resin having a high transparency characteristic is used for the material of the core and the clad.

Next, Au bump 62 may be provided at the electrodes 33 of the optical devices 31, that is, the light emitting device 5a and the light receiving device 6a, and mounted on the flexible circuit board 2 by a flip-chip mounting process using ultrasonic waves. In this process, those devices may be alighted for establishing the optical coupling as shown in FIG. 6.

The driver 5 and the amplifier 6b, both forming IC71, are mounted on the flexible circuit board 2 as shown in FIG. 7 by a die-bonding process using silver paste so that the lands on the flexible circuit board 2 may be bonded to the side of IC71 on which the electrodes are not formed, and by wire-bonding 72 so that the electrodes of IC71 and the electrodes of the flexible circuit board 2 may be bonded together.

Next, the light emitting device 5a, the driver 5b, the light receiving device 6a and the amplifier 6b are sealed with the transparent resin in order to assure the water resistance of the connecting part. It is preferable that the resin used for sealing has a water resistance characteristic as well as a transparency characteristic and a stress relaxation characteristic. In this embodiment, rubber-like silicon-based resin is used.

In the experimental measurement of the transmission characteristic of the optical circuit board 1 in Embodiment #1 so fabricated in the process described above, it is proved that an excellent transmission can be established in transmitting 4 Gbit/s signals through the optical interconnection 4a for high-speed data transmission and transmitting 1 Mbit/s signals through the electric interconnection 31 for low-speed data transmission.

Embodiment #2

Embodiment #2 is realized in almost the similar process to Embodiment #1, in which the driver 5a and the amplifier 6b forming IC71 are mounted by a flip-chip process using Au bump 62 as shown in FIG. 8. Next, the protective layer 105 is added on the optical interconnection 104 as shown in FIG. 10 by using a polyimide tape. It will be appreciated that bending durability for extremely small radius or for one million bending cycles can be established by adding the protective layer 105 composed of a polyimide-based tape having 25 mm thickness onto the overall parts of the optical interconnection 104 having a laminated structure composed of acryl-based resin.

Table 1 shows the result of bending test of Embodiment #1, Embodiment #2 and the comparative example.

|  | Bending Durability (5 mm Bending Radius) |
|---|---|
| With Protective Layer (Embodiment #2) | Durable for one million or more bending cycles |
| Without Protective Layer (Embodiment #1) | Durable for one million or less bending cycles |
| Comparative Example | Clacks generated in Acryl-based layer |

According to Table 1, in case of the comparative example without using the protective layer 105, the acryl-based layer with less bending durability is clacked and broken down, but in case of using the protective layer 105, the acryl-based layer is not broken down even for one million bending cycles and thus high bending durability can be established.

Embodiment #3

Embodiment #3 is realized in almost the similar process to Embodiment #1, in which the circuit device 95a including four (4) light emitting devices, the circuit device 95b including four (4) drivers, the circuit device 96a including four (4) light receiving devices and the circuit device 96b including four (4) amplifiers, each configured in an array configuration, are used. The placement spacing in the array is 250 □m. The number of electric interconnections and the number of optical interconnections are as shown in FIG. 9. The optical interconnections 94 are disposed at the exactly back side of the electric interconnections 93k having 200 □m width.

In the experimental measurement of the transmission characteristic of the optical circuit board 91 in Embodiment #3 so fabricated in the process described above, it is proved that the cross-talk between the channels adjacent physically to each other is 20 dB or more and thus an excellent transmission can be established in transmitting 4 Gbit/s signals through the channel (the individual optical interconnections 94 and their corresponding electric interconnections 93) for high-speed data transmission. Note that a larger cross-talk represent numerically a better transmission characteristic.

What is claimed is:

1. An optical circuit board comprising:
    a flexible circuit board composed of a film having a flexibility;
    one or more electrical interconnections provided at said flexible circuit board;
    one or more optical interconnections provided at said flexible circuit board;
    an optical transmitter for converting an electrical signal supplied at a designated electrical interconnection of said electrical interconnections provided at said flexible circuit board into an optical signal;
    an optical receiver for reconverting said optical signal emitted by the designated electric interconnection provided at said flexible circuit board into an electrical signal and for outputting said reconverted electrical signal to another electrical interconnection, and
    wherein a placement spacing between plural optical interconnections is equivalent to a placement spacing between plural electrical interconnections.

2. An optical circuit board of comprising:
    a flexible circuit board composed of a film having a flexibilty;
    one or more electrical interconnections provided at said flexible circuit board;
    one or more optical interconnections provided at said flexible circuit board;
    an optical transmitter for converting an electrical signal supplied at a designated electrical interconnection of said electrical interconnections provided at said flexible circuit board into an optical signal; and
    an optical receiver for reconverting said optical signal emitted by the designated electrical interconnections provided at said flexible circuit board into an electrical signal and for outputting said reconverted electrical signal to another electrical interconnection,
    wherein a mirror is provided so as to face to said optical interconnection and being inclined at a 45-degree angle with respect to said flexible circuit board.

* * * * *